United States Patent
Fock et al.

(10) Patent No.: US 6,762,510 B2
(45) Date of Patent: Jul. 13, 2004

(54) FLEXIBLE INTEGRATED MONOLITHIC CIRCUIT

(75) Inventors: Johann-Heinrich Fock, Hamburg (DE); Wolfgang Schnitt, Norderstedt (DE); Hauke Pohlmann, Hamburg (DE); Andreas Gakis, Hamburg (DE); Michael Burnus, Neu Wulmsorf (DE); Martin Schaefer, Ahrensburg (DE); Henricus Godefridus Rafael Maas, Eindhoven (NL); Theodorus Martinus Michielsen, Eindhoven (NL); Ronald Dekker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/140,663

(22) Filed: May 8, 2002

(65) Prior Publication Data

US 2003/0057525 A1 Mar. 27, 2003

(30) Foreign Application Priority Data

May 8, 2001 (DE) .......................................... 101 22 324

(51) Int. Cl.⁷ .............................................. H01L 23/48
(52) U.S. Cl. ........................ 257/787; 257/791; 257/792
(58) Field of Search ................................. 257/759, 787, 257/788, 791, 792, 793

(56) References Cited

U.S. PATENT DOCUMENTS

| | | | | |
|---|---|---|---|---|
| 3,670,639 A | * | 6/1972 | Harnden, Jr. ................... 95/111 |
| 4,876,120 A | * | 10/1989 | Belke et al. ................... 428/1 |
| 5,011,872 A | * | 4/1991 | Latham et al. ............... 523/440 |
| 5,126,920 A | * | 6/1992 | Cardashian et al. ........ 361/398 |
| 5,405,937 A | * | 4/1995 | Lemaire et al. ............. 528/377 |
| 5,826,329 A | * | 10/1998 | Roth .......................... 29/846 |
| 5,883,135 A | * | 3/1999 | Gyory et al. ................ 514/724 |
| 5,923,115 A | * | 7/1999 | Mohr, III et al. ........... 310/334 |
| 6,027,958 A | | 2/2000 | Vu et al. ..................... 438/110 |
| 6,136,127 A | * | 10/2000 | De Bastiani ................ 156/230 |
| 6,455,931 B1 | * | 9/2002 | Hamilton, Jr. et al. ...... 257/723 |

* cited by examiner

Primary Examiner—T. N. Quach
(74) Attorney, Agent, or Firm—Aaron Waxler

(57) ABSTRACT

A flexible monolithic integrated circuit which is essentially formed from flexible circuit elements, connecting elements between the flexible circuit elements, and a flexible coating which comprises at least one layer of a coating material comprising a polymer, is suitable as a small and convenient integrated circuit for electronic devices on flexible data carriers for the logistic tracking of objects and persons.

The invention also relates to a method of manufacturing a flexible integrated monolithic circuit whereby integrated monolithic circuit elements and connecting elements are formed in and on a semiconductor substrate, the main surface of the integrated circuit elements facing away from the semiconductor substrate are coated with a polymer resin, and the semiconductor substrate is removed. The method is based on conventional process steps in semiconductor technology and leads to a flexible integrated monolithic circuit in a small number of process steps.

10 Claims, 1 Drawing Sheet

FLEXIBLE INTEGRATED MONOLITHIC CIRCUIT

BACKGROUND AND SUMMARY OF THE INVENTION

The invention relates to a flexible integrated monolithic circuit which comprises flexible circuit elements.

Conventional monolithic integrated circuits comprise widely varying circuit elements such as diodes, transistors, resistors, capacitors, and coils incorporated into or on a common monocrystalline semiconductor wafer. The multiple, complicated construction of the integrated circuit from semiconductor zones, insulating barrier regions, and metallically conducting connections is very thin, often extending no more than a few micrometers in depth, and the electrical charge carriers move in thin layers and channels practically at the chip surface.

Experiments have shown that thin layers of semiconductor material with a layer thickness of less than 50 $\mu$m are flexible in themselves, and that integrated circuits with this layer thickness also remain operational after repeated bending stresses. It is only the great thickness, in relation to the depth of the circuit elements, of the semiconductor chip of conventional construction which renders the chips rigid.

If the surface layer with the functional elements and their interconnections is successfully detached from the rigid base, it is possible to manufacture flexible integrated circuits.

Known flexible integrated circuits of this kind have become the target of wide-ranging technological efforts because of a rising demand for small and convenient integrated circuits for electronics on flexible data carriers for the logistical tracking of objects and persons.

The development trend, in particular for chip cards as data storage cards or smart cards, is towards the development of a multifunctional card with data transfer with or without contacts, so that the use of the chip card can be extended to widely varying fields such as payment, health, telecommunication, and security. For this purpose they are fitted with electronic semiconductor circuits of even larger size so as to accommodate more electronic functions on the card. If these semiconductor circuits are implemented in conventional semiconductor technology on a rigid chip, they will tend to crack or break when the user bends the card. There is accordingly a demand for integrated circuits for chip cards with a high degree of integration which are capable of withstanding strong mechanical loads.

A flexible integrated circuit for smart cards is known from U.S. Pat. No. 6,027,958 which integrated circuit comprises a silicon semiconductor material on a silicon dioxide layer, an integrated circuit manufactured with th silicon semiconductor material, an enveloping layer of silicon dioxide or silicon nitride for sealing off the integrated circuit, and a flexible support layer which is connected to the integrated circuit.

A flexible integrated circuit in accordance with U.S. Pat. No. 6,027,958, however, has various disadvantages as regards its manufacture and operation. Thus the manufacturing process comprises a plurality of process steps which substantially increase the manufacturing cost and the reject percentage. Special attention must be given also to the quality of the layers, and in particular to the mutual adhesion thereof and the accompanying delamination effects in the case of flexible integrated circuits. Enveloping layers of $SiO_2$ or $Si_3N_4$ are brittle, prone to fractures, tend to show cracks, and have a bad adhesion.

It is accordingly an object of the present invention to provide a flexible integrated circuit which has improved bonding properties and which can be realized in a simple and inexpensive manner in substantially any size.

According to the invention, this object is achieved by means of a flexible integrated monolithic circuit which is substantially formed by flexible circuit elements, connecting elements between the flexible circuit elements, and a flexible coating which comprises at least one layer of a layer material comprising a polymer.

The flexible coating made from a layer material comprising a polymer performs three functions at the same time: it acts as a passivating layer, as a planarizing layer, and as a mechanical support for the integrated circuit elements and their interconnecting elements. The polymer layer serves to passivate and planarize the circuit elements. At the same time, the polymer layer provides the end product with a sufficient mechanical stability so as to serve as the sole support for the integrated monolithic circuit.

It is preferred for the present invention that the polymer is chosen from the group of polyimide, polycarbonate, fluorocarbon, polysulphon, epoxide, phenol, melamine, polyester, and silicon resins or their co-polymers.

It is particularly preferred that the polymer is chosen from the group of polyimide resins. The flexible integrated monolithic circuit according to the invention will show a very low risk of delamination of the layers as a result of this.

In an embodiment of the invention, the layer material comprises a reinforcement material for mechanical reinforcement of the coating.

In another embodiment of the invention, the layer material comprises a thermally conductive filler material. The filler materials for improving the thermal conductivity compensate for the low thermal conductivity of polymeric materials.

The layer material of the flexible integrated monolithic circuit may comprise a pigment for optical screening of the integrated circuit. In a further embodiment of the invention, the layer material comprises an electrically conductive filler material. A coating provided with an electrically conductive filler material renders it possible to manufacture contacts through pressure contacting without the laborious etching of contact holes. In addition, the electrically conductive filler material may at the same time form an electromagnetic screening for the circuit elements.

The coating may also comprise a field plate, again for electromagnetic screening of the integrated circuit.

In a preferred embodiment of the invention, the coating comprises a first layer on a first surface and a second layer on a second surface of the flexible integrated monolithic circuit. The circuit elements are thus embedded in a polymer foil. The two-sided coating reduces the surface stresses and offers a mechanical support for both main surfaces of the flexible integrated monolithic circuit.

In a further preferred embodiment of the invention, the flexible coating of at least one layer of a coating material comprising a polymer is provided with flexible circuit elements on both of its side (or surfaces). This has the following important advantages. Firstly, the packing density may be increased by up to a factor of two. Secondly, it has been observed that there is hardly any tendency of such a device to curl up; it remains perfectly flat. This is probably due to a balancing of stresses on both sides of the flexible coating. This is a very important features as it renders possible all kinds of processing of the device which require that the device to be processed is flat, for example dicing processes or marking processes. In view of this feature, the device preferably has a symmetrical structure with respect to the flexible coating. Finally, an advantage is provided that the flexible coating is transparent, so that flexible circuit elements on both sides of the coating may optically communicate with each other. In that case one of the circuit elements may be a radiation-omitting device comprising, for example, a III-V semiconductor material, whereas the other circuit element may comprise a semiconductor material which is sensitive to the radiation emitted by the one circuit element.

The invention also relates to a method of manufacturing a flexible integrated monolithic circuit whereby integrated monolithic circuit elements and connecting elements are formed in and on a semiconductor substrate, the main surface of the integrated circuit elements facing away from the semiconductor substrate is coated with a polymer resin, and the semiconductor substrate is removed.

The method is based on process steps usual in semiconductor technology and will lead to a flexible integrated monolithic circuit in a small number of process steps.

In a preferred embodiment of a method according to the invention, both sides of the flexible coating are provided with flexible circuit elements in a similar way. This has the important advantages mentioned above. The substrates of the semiconductor bodies comprising the circuit elements may be removed in a similar manner, either in the same or in different process steps.

Particularly preferred is a method whereby the coating comprising a polymer is provided in a spin coating process. A spin coating process has an excellent planarizing effect. The provision of the coating in a spin coating process levels out the surface steps of the integrated circuit elements, and a circuit with a planar surface is obtained.

If the other side of the flexible coating is to be provided with further flexible circuit elements, the coating layer comprising the polymer is preferably provided with a thin (e.g. 0.5 $\mu$m thick) layer of silicon dioxide which in its turn is provided with a so-termed primer layer, for example of MOPS (=metacryloxypropyltrimethoxysilane), before a glue is provided thereon to which the further semiconductor body comprising the further (flexible) circuit elements is attached, permanently in this case. Afterwards, the (semiconductor) substrates of the semiconductor bodies on either side of the coating may be removed, either at the same time or separately.

BRIEF DESCRIPTION OF THE DRAWING

The invention will now be explained in more detail with reference to six Figures.

DETAILED DESCRIPTION OF THE INVENTION

Figure 1:
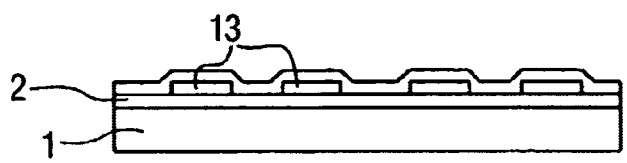
FIGS. 1 to 6 diagrammatically show the intermediate products of the manufacturing method according to the invention in cross-section.
Figure 2:
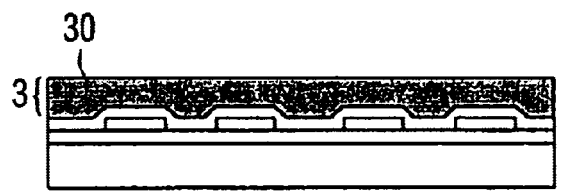

The flexible monolithic integrated circuit according to the invention is substantially formed by flexible circuit elements 2, connecting elements between the flexible circuit el ments 13, and a flexible coating 3, said flexible coating 3 comprising at least one layer of a coating material comprising a polymer. Such an integrated circuit may be constructed, for example, as a data storage circuit, as a digital circuit, or as an analog circuit.

The circuit elements 2 of the flexible integrated monolithic circuit may comprise any suitable active and passive components, for example diodes, Schottky diodes, CMOS transistors, bipolar transistors, thin-film transistors, capacitors, resistors, coils, micro- and nano-components such as IR and UV sensors, gas sensors, optoelectronic components, and their respective connecting elements.

The connecting elements 13 represent the electrical contacts between the doped regions of the integrated circuit elements and interconnect the individual components of an integrated monolithic circuit. They extend the connections further to the edge of the integrated monolithic circuit, where they are widened into bond pads. Usually the connecting elements are arranged on one or both main surfaces of the flexible integrated monolithic circuit.

The flexible integrated monolithic circuit further comprises a flexible coating 3, which flexible coating 3 comprises at least one layer of a coating material comprising a polymer 30. The flexible coating may furthermore comprise layers of other materials, for example of a dielectric material which electrically insulates the integrated circuit, or in addition protects it from ambient influences. The flexible coating may also comprise two layers, each arranged on one of the two main surfaces of the integrated circuit elements and together sealing off the integrated circuit the second layer on the second side reduces the surface stresses.

The thickness of the polymer layers 30 typically lies at 1 to 50 $\mu$m, preferably at 2 to 5 $\mu$m.

Polymers which may be used are, for example, epoxide, phenol, melamine, polyester, and silicone resins or their co-polymers singly or mixed with other polymers, and may be reinforced with fibers, pigments, fillers, glass, or metal. High-grade products which are still stable also at higher operating temperatures are based on polyimide resins, polycarbonate resins, fluorocarbon resins (Teflon), or polysulphon resins.

Particularly preferred layer materials are polymeric resins chosen from the group formed by polyimide and benzocyclobutadiene.

Polyimides are polymeric resins which comprise aromatic groups and the acidic imide group. Examples of polyimide polymers are the polyimides, polyisoimides, maleinimides, bismaeinimides, polyamideimides, polymidimides, polyetherimides, and polyimide-isoindoloquinazolinedionimide. A preferred polyimide is Kapton®, which is polycondensed from 4,4'-oxydianiline and pyromellithic acid dianhydride.

The polyimides act as a voltage buffer. They have an excellent scratch resistance, which renders them suitable as mechanical protection layers.

An alternative preferred flexible coating material 30 which may be used is benzocyclobutadiene. It is characterized by a low water absorption and lower processing temperatures.

In a further preferred embodiment of the invention, the layer material is a charged polymer. The charging material may achieve a mechanical reinforcement, an improvement in the thermal or electrical conductivity of the polymer layer, or an optical screening of the circuit elements.

Suitable mechanical reinforcement materials are, for example, organic polymeric fibers such as aramide fibers, carbon fibers, or glass fibers. The addition of thermally conductive filler materials can improve the thermal conductivity of the resin matrix. Polymeric layers act as thermal resistors to a certain degree, and they must be taken into account in the judgement of the heat balance of an integrated monolithic circuit. Aluminum oxide, boron nitride, and copper particles with oxidized surfaces are preferably used.

Fillers for improving the electrical conductivity can compensate for the low electrical conductivity of polymer materials. As an isotropically conducting filler, silver in flat particles or flakes is the most suitable filler. Further preferred electrically conducting fillers are graphite and metal particles comprising copper, nickel, gold, or aluminum.

Pigments for optical screening which may be used are $SnO_2$, ITO, $TiO_2$, and ZnO.

The flexible integrated monolithic circuit according to the invention is manufactured in a process wherein integrated monolithic circuit elements 2 and connecting elements 13 are formed in and on a semiconductor substrate 1, the first surface of the integrated circuit elements 2 and the connecting elements 13 facing away from the semiconductor substrate 1 is provided with a coating 3 which comprises at least one layer of a coating material comprising a polymer 30, and the semiconductor substrate 1 is removed.

A method of forming a flexible integrated monolithic circuit in a first embodiment will now be explained in more detail below with reference to FIGS. 1 to 6, which show steps in the manufacturing process in cross-section.

The integrated monolithic circuit is first built up into a component in which all integrated circuit elements 2, for example diodes, transistors, resistors, including the connections between the integrated circuit elements, are arranged in or on a common, first temporary substrate in a manner known to those skilled in the art so as jointly to constitute the component.

FIG. 1 shows a planar first temporary semiconductor element substrat 1. The semiconductor substrate 1 may be chosen from a plurality of possible substrates, for example monocrystalline silicon of semiconductor quality, polycrystalline silicon of semiconductor quality, amorphous silicon of semiconductor quality, silicon on glass, silicon or sapphire, or silicon on quartz. The semiconductor substrate shown in FIG. 1 is a SOI substrate.

Active and possibly also passive circuit elements 2 are formed in or on one of the main surfaces of the substrate by a conventional semiconductor technology, for example planar technology or SOI technology.

To manufacture the integrated circuit elements, processes are carried out at or in the vicinity of the surface of a monocrystal of a defined conductivity type and an exact conductivity level. The introduction of the circuit elements 2 takes place, for example by the planar or SOI technology selectively by means of several oxidation steps, photolithography steps, selective etching steps, and intermediate doping steps such as diffusion or ion implantation.

The entire wafer surface is covered with a metal, metal silicide, or strongly doped polycrystalline silicon for the manufacture of the connecting elements of metal, metal silicide, or strongly doped polycrystalline silicon which connect the circuit elements of an integrated circuit to one another and to the contact pads at the edge of the circuit, whereupon the superfluous regions of the layer are removed by wet chemical or dry etching so as to obtain a structure.

The integrated circuit elements 2 built up on the semiconductor substrate including their connecting elements 13 are then coated with the flexible coating 3 on the surface facing away from the semiconductor substrate.

For this purpose, a thin layer of a coating material comprising a polymer 30 is provided over the entire surface or portions thereof. Preferably, the layer is provided by spin coating, spraying, or the formation of a film and is subsequently cured.

The starting material for a layer of polyimide resin is formed by the chemical precursor of the polyimide dissolved in a solvent. After spin-coating of the substance onto the wafer, the solvent is evaporated at 100° C. Polymerization then takes place at a temperature of 300 to 400° C.

In an embodiment of the invention, the polymer layer 30 comprises a field plate (floating junction). To make a field plate, a first thin layer of the polymers may be provided, then a very thin layer of a conductive material, and subsequently a further layer of a polymer.

The wafer with the first temporary semiconductor substrate 1 and the circuit elements 2 arranged thereon, coated with a flexible layer 3, is subsequently fastened by its coated first main surface onto a second temporary carrier substrate (handling wafer) 5 by means of an adhesion layer or release layer 60, as shown diagrammatically in FIGS. 3 and 4.

The adhesion or release layer 60 is preferably a layer which can be easily removed again in a thermal process or by means of a solvent or by some other method which does not constitute a considerable thermal, mechanical, or chemical load on the circuit elements. The thermal process should preferably take place below 300° C., in particular below 150° C. A suitable adhesion layer is a photoresist layer of a photoresist material which is soluble in acetone. The adhesion layer may be provided by spin coating. Alternatively, the adhesion layer may be made of wax.

The second temporary carrier 5 or handling wafer may be made of any suitable material, for example a semiconductor material, a ceramic material such as aluminum oxide, glass, or quartz, or a metal such as aluminum.

Figure 5:
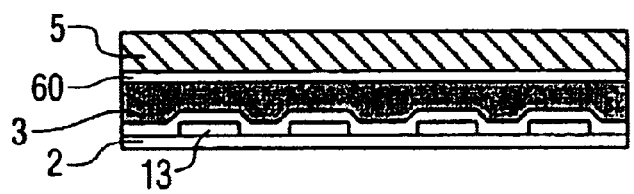

The first temporary semiconductor substrate 1 is now removed from the other main surface until the rear side of the integrated circuit elements 2 is exposed, see FIG. 5.

Techniques suitable for removing the first semiconductor substrate 1 are lapping, wet chemical etching, and grinding of the wafer rear side.

During lapping, the circuit side of the wafer is fastened on the rotor of a lapping machine by means of wax, such that its rear side slides over the lapping disc. The lapping agent is silicon carbide or aluminum oxide powder which is mixed with wax. The wafer thickness can be reduced down to 250 µm in this manner.

Alternatively, a removal of the first substrate by wet chemical etching solvents is possible, during which a paint or wax masks the structured surface. Dilute mixtures of hydrofluoric and nitric acid render possible etching rates of 1 to 2 µm/min. This etching process may also be carried out subsequent to the lapping process.

A suitable method for removing the first substrate is the grinding method. Rotating grinding discs coated with diamond remove the unwanted material from the rear side of the wafer in a coarse manner at high speed. In a subsequent fine grinding stage, a surface with a roughness of less than 100 nm and a thickness tolerance of the wafer of ±3 µm is obtained.

Alternatively, the first substrate 1 may be split up if the integrated circuit elements are provided on an easily separable substrate layer, for example a porous silicon dioxide layer.

At this point in the manufacturing sequence, an additional metallization level with bond pads may be provided on the exposed rear side of the integrated circuit elements 2, if so desired. Similarly, a further polymer layer may be provided on the rear side. In an alternative embodiment, a protective foil, which may also serve to enhance the mechanical stability, may be adhered by suitable means or may be provided in some other manner.

Then the connection between the second temporary carrier 5 or handling wafer and the flexible coating may be eliminated. Suitable methods are, for example, peeling off of the flexible integrated circuit through fastening of an adhesive tape and pulling off of the "foil", or a chemical, thermal, or mechanical treatment of the adhesion layer.

Figure 6:
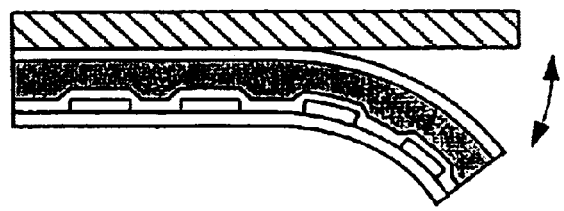

After the separation from the temporary handling wafer 5 as shown in FIG. 6, and possibly of the adhesion layer, the flexible coating 3 and the circuit elements 2 with their connecting elements 13 together form the flexible integrated circuit.

A semiconductor film with integrated circuit elements 2 complete with the associated interconnections is then available for further processing, fully contacted and free from remainders of the first semiconductor substrate 1, and with a defined rear surface.

The entire structure is flexible and may be used in the flexible state, but it may alternatively be connected to a fixed or flexible substrate. It is advantageous for some applications when the entire integrated circuit remains flexible, for example for providing it on curved housings of electronic consumer goods, or simply to reduce its weight. Similarly, a large-area flexible integrated circuit may simply be rolled up for transport.

It may be used for the applications mentioned above as well as for use with conventional labeling techniques, labeling of storehouse articles for logistic management of the storehouse contents by means of contactless data transmission via radio, labeling of goods, large-area integrated panel surfaces for solar cells, and for flat picture screens with TFT addressing.

Embodiment

At the end of the manufacturing process of a silicon wafer with integrated monolithic circuits (FIG. 1) obtained in a conventional manner in planar technology or SOI technology, a liquid polymer film 30 (FIG. 2) of a few micrometer thickness is provided on the component side and cured. The polymer film 30 may be provided by means of commercially available painting apparatuses within the framework of the semiconductor manufacturing process. Polyimide is particularly suitable because it is mechanically and thermally very stable after cross-linking. After a suitable pre-treatment with an adhesion agent 60 (primer), a carrier disc 5 (FIG. 3) is fixed on the wafer coated with polyimide by m ans of an adhesive 60 which can be easily removed later (FIGS. 3, 4). Suitable are, for example, acrylates or epoxy glues which are cured thermally or by UV irradiation. The carrier disc 5 (for example glass) provides a sufficient rigidity for enabling the use of machines usual in semiconductor manufacture during the subsequent removal of the silicon substrate 1 down to a thin remaining layer and its further treatment. The carrier disc 5 is removed again in a later stage and may be re-used. The adhesive 60 also has no significance for the end product.

The silicon of the wafer 1 supporting the components (FIG. 4) is now removed from the rear side down to a desired thickness (typically 0.2 to $20\mu$) through mechanical grinding and/or wet chemical etching. A suitable etch stop layer (FIGS. 4, 5), for example the buried oxide of a SOI wafer or a strongly doped layer in the silicon wafer, serves to control the silicon removal.

A thin layer of monocrystalline silicon remains, including the wiring layers and passivating layers and a polyimide layer connected to the carrier wafer by means of the adhesive layer.

This layer remaining on the carrier wafer including all circuit elements is coated with an additional passivating layer (for example plasma nitride or BCB) on its etched-back surface and is provided with contact holes for subsequent contacting. It is also possible to provide further metallization layers on this side by processes usual in semiconductor manufacture, so that the subsequent ICs can have one or several wiring levels on its upper and lower sides.

The carrier wafer is then removed (FIG. 6). This may be a purely mechanical separation in that the thin polyimide foil (Kapton) with the integrated circuits is peeled off the carrier wafer or is separated by chemical means.

This results in the integrated monolithic circuits complete with the wiring and passivating layers on the upper and lower sides on a thin, flexible, and (if so desired) transparent foil as the carrier layer. The method is not limited to SOI wafers and may be carried out for all conventional semiconductor wafers in a semiconductor manufacturing process.

Figure 3:
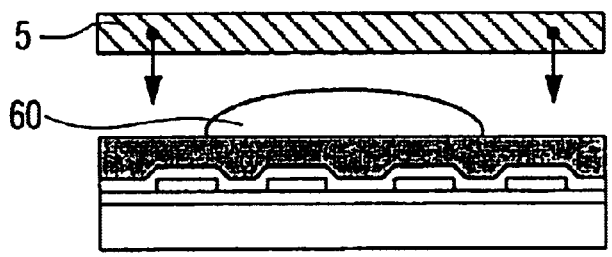
Figure 4:
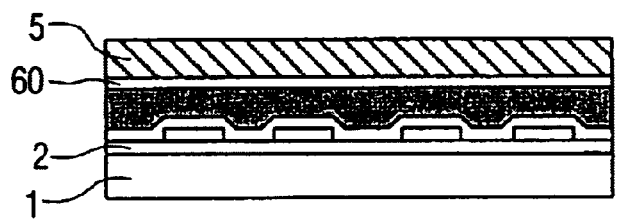

In a favorable modification, another silicon wafer with integrated monolithic circuit elements is attached to the first silicon wafer instead of the carrier plate 5 in FIG. 3. Instead of a temporary glue, a glue is used in this case which is intended to be permanent. As is shown in FIG. 4, the substrate of the first silicon wafer is removed, for example by CMP (=Chemical Mechanical Polishing), also in this case. In the same way, the substrate of the second silicon wafer is removed. The result of this modification—which is not shown in the drawing—is a flexible coating of, for example, polyimide which is covered on both sides with flexible circuit elements.

The method described is not applied to individual ICs, but it is a wafer-scale process, which is a distinct difference with and advantage over methods known until now.

Individual integrated circuits may be obtained immediately by cutting out from the foil or in a subsequent re-gluing process.

What is claimed is:

1. A flexible monolithic integrated circuit comprising: flexible circuit elements, connecting elements between the flexible circuit elements, and a flexible coating covering the flexible circuit elements and connecting elements which comprises at least one layer of a layer material comprising a polymer, wherein the flexible coating acts as a passivating layer, a planarizing layer, and a mechanical support for the flexible circuit elements and the connecting elements.

2. A flexible monolithic integrated circuit as claimed in claim 1, characterized in that the polymer is chosen from the group of polyimide, polycarbonate, fluorocarbon, polysulphon, epoxide, phenol, melamine, polyester, and silicon resins or their co-polymers.

3. A flexible monolithic integrated circuit as claimed in claim 1, characterized in that the polymer is chosen from the group of polyimide resins.

4. A flexible monolithic integrated circuit as claimed in claim 1, characterized in that the coating material comprises a reinforcement material.

5. A flexible monolithic integrated circuit as claimed in claim 1, characterized in that the coating material comprises a thermally conductive filler material.

6. A flexible monolithic integrated circuit as claimed in claim 1, characterized in that the coating material comprises an electrically conductive filler material.

7. A flexible monolithic integrated circuit as claimed in claim 1, characterized in that the coating material comprises a pigment.

8. A flexible monolithic integrated circuit as claimed in claim 1, characterized in that the coating comprises a field plate.

9. A flexible monolithic integrated circuit as claimed in claim 1, characterized in that the coating comprises a first layer on a first surface and a second layer on a second surface of the flexible integrated monolithic circuit.

10. A flexible monolithic integrated circuit as claimed in claim 1, characterized in that the flexible coating is provided with flexible circuit elements on both its mutually opposed main surfaces.

* * * * *